United States Patent
Myers et al.

(10) Patent No.: US 11,194,362 B2
(45) Date of Patent: Dec. 7, 2021

(54) HANDHELD DEVICE ENCLOSURE HAVING AN OUTER PERIPHERY MEMBER AND FRONT AND REAR COVER ASSEMBLIES

(71) Applicant: Apple Inc., Cupertino, CA (US)

(72) Inventors: Scott Myers, Saratoga, CA (US); Matthew Theobald, San Francisco, CA (US); Richard Heley, Los Altos, CA (US); Adam Stagnaro, Santa Cruz, CA (US); Richard Hung Minh Dinh, Cupertino, CA (US); David Pakula, San Francisco, CA (US); Tang Yew Tan, Palo Alto, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/994,299

(22) Filed: Aug. 14, 2020

(65) Prior Publication Data

US 2020/0379519 A1    Dec. 3, 2020

Related U.S. Application Data

(63) Continuation of application No. 16/405,239, filed on May 7, 2019, now Pat. No. 10,754,388, which is a
(Continued)

(51) Int. Cl.
*G06F 1/16* (2006.01)
*H04M 1/02* (2006.01)
(Continued)

(52) U.S. Cl.
CPC .......... *G06F 1/1656* (2013.01); *G06F 1/1626* (2013.01); *G06F 1/1658* (2013.01);
(Continued)

(58) Field of Classification Search
CPC .... G06F 1/1656; G06F 1/1684; G06F 1/1626; G06F 1/1698; G06F 1/1658;
(Continued)

(56) References Cited

U.S. PATENT DOCUMENTS 4,484,573 A    11/1984  Yoo
5,054,120 A    10/1991  Ushiyama
(Continued)

FOREIGN PATENT DOCUMENTS

CN    1270714    10/2000
CN    1489017    4/2004
(Continued)

*Primary Examiner* — Zachary Pape
(74) *Attorney, Agent, or Firm* — Brownstein Hyatt Farber Schreck, LLP

(57) ABSTRACT

This is directed to an electronic device enclosure. The enclosure includes an outer periphery member forming an outer surface of a device, and to which an internal platform is connected. Electronic device components can be assembled to one or both surfaces of the internal platform. The enclosure can include front and back cover assemblies assembled to the opposite surfaces of the outer periphery member to retain electronic device components. One or both of the cover assemblies can include a window through which display circuitry can provide content to a user of the device.

20 Claims, 9 Drawing Sheets

Related U.S. Application Data continuation of application No. 15/892,310, filed on Feb. 8, 2018, now Pat. No. 10,303,219, which is a continuation of application No. 15/168,194, filed on May 30, 2016, now Pat. No. 9,898,049, which is a continuation of application No. 14/064,785, filed on Oct. 28, 2013, now Pat. No. 9,357,665, which is a continuation of application No. 12/794,529, filed on Jun. 4, 2010, now Pat. No. 8,576,561.

(60) Provisional application No. 61/325,786, filed on Apr. 19, 2010, provisional application No. 61/325,625, filed on Apr. 19, 2010, provisional application No. 61/300,780, filed on Feb. 2, 2010.

(51) Int. Cl.
| | |
|---|---|
| *H05K 5/03* | (2006.01) |
| *H05K 5/02* | (2006.01) |
| *H01Q 1/22* | (2006.01) |
| *H01Q 1/24* | (2006.01) |
| *H01Q 1/42* | (2006.01) |

(52) U.S. Cl.
CPC .......... *G06F 1/1684* (2013.01); *G06F 1/1698* (2013.01); *H01Q 1/2258* (2013.01); *H01Q 1/241* (2013.01); *H01Q 1/42* (2013.01); *H04M 1/026* (2013.01); *H04M 1/0249* (2013.01); *H04M 1/0274* (2013.01); *H05K 5/02* (2013.01); *H05K 5/0208* (2013.01); *H05K 5/0247* (2013.01); *H05K 5/03* (2013.01); *Y10T 29/49002* (2015.01); *Y10T 29/49169* (2015.01)

(58) Field of Classification Search
CPC .. H04M 1/0274; H04M 1/026; H04M 1/0249; H01Q 1/241; H01Q 1/2258; H05K 5/0208; H05K 5/02; H05K 5/03; Y10T 29/49002; Y10T 29/49169
See application file for complete search history.

(56) References Cited

U.S. PATENT DOCUMENTS

| | | | |
|---|---|---|---|
| 5,268,699 A | 12/1993 | Laute | |
| 5,930,694 A | 7/1999 | Shima | |
| 6,058,293 A | 5/2000 | Phillips | |
| 6,229,993 B1 | 5/2001 | Greenaway et al. | |
| 6,396,923 B1 | 5/2002 | Kitamura et al. | |
| 6,503,766 B1 | 1/2003 | Ni | |
| 6,512,454 B2 | 1/2003 | Miglioli et al. | |
| 6,728,112 B1 | 4/2004 | Qin et al. | |
| 6,788,532 B2 | 9/2004 | Yang et al. | |
| 6,965,789 B2 | 11/2005 | Hauge et al. | |
| 6,980,777 B2 | 12/2005 | Shepard et al. | |
| 7,069,061 B2 | 6/2006 | Gammon et al. | |
| 7,215,600 B1 | 5/2007 | DeRosa | |
| 7,236,588 B2 | 6/2007 | Gartrell | |
| 7,271,769 B2 | 9/2007 | Asano et al. | |
| 7,330,356 B2 | 2/2008 | Park | |
| 7,330,743 B2 | 2/2008 | Hutchinson et al. | |
| 7,599,146 B2 | 10/2009 | Wu et al. | |
| 7,612,997 B1 | 11/2009 | Diebel et al. | |
| 7,885,653 B2 | 2/2011 | Yamamoto et al. | |
| 8,126,138 B2 | 2/2012 | Dinh et al. | |
| 8,148,633 B2 | 4/2012 | Hung | |
| 8,264,837 B2 | 9/2012 | Pakula et al. | |
| 8,270,914 B2 * | 9/2012 | Pascolini | H01Q 13/10 455/90.2 |
| 8,551,283 B2 | 10/2013 | Pakula et al. | |
| 8,576,561 B2 | 11/2013 | Myers et al. | |
| 8,797,721 B2 | 8/2014 | Pakula et al. | |
| 8,913,395 B2 | 12/2014 | Myers et al. | |
| 9,185,816 B2 | 11/2015 | Pakula et al. | |
| 9,357,665 B2 | 5/2016 | Myers | |
| 9,898,049 B2 | 2/2018 | Myers | |
| 10,303,219 B2 | 5/2019 | Myers et al. | |
| 2003/0045324 A1 | 3/2003 | Nagumo | |
| 2003/0220129 A1 | 11/2003 | Pan et al. | |
| 2005/0282470 A1 | 12/2005 | Steckenrider et al. | |
| 2006/0061512 A1 | 3/2006 | Asano et al. | |
| 2007/0057853 A1 | 3/2007 | Chang et al. | |
| 2007/0115644 A1 | 5/2007 | Kim et al. | |
| 2007/0279859 A1 | 12/2007 | Canova et al. | |
| 2008/0025005 A1 | 1/2008 | Yeh et al. | |
| 2008/0053649 A1 | 3/2008 | Muramatsu et al. | |
| 2008/0165067 A1 | 7/2008 | Kim et al. | |
| 2008/0225468 A1 | 9/2008 | Huang et al. | |
| 2008/0316116 A1 * | 12/2008 | Hobson | H01Q 9/0421 343/702 |
| 2008/0316121 A1 | 12/2008 | Hobson et al. | |
| 2009/0066588 A1 | 3/2009 | Cheng et al. | |
| 2009/0245564 A1 | 10/2009 | Mittleman et al. | |
| 2009/0247237 A1 | 10/2009 | Mittleman et al. | |
| 2010/0020034 A1 | 1/2010 | Kim | |
| 2011/0187245 A1 | 8/2011 | Pakula et al. | |
| 2011/0188180 A1 | 8/2011 | Pakula et al. | |

FOREIGN PATENT DOCUMENTS

| | | |
|---|---|---|
| CN | 1577188 | 2/2005 |
| CN | 2777980 | 5/2006 |
| CN | 1874169 | 12/2006 |
| CN | 101010706 | 8/2007 |
| CN | 101267719 | 9/2008 |
| CN | 101447599 | 6/2009 |
| CN | 101466214 | 6/2009 |
| DE | 29720510 | 3/1999 |
| EP | 1633176 | 3/2006 |
| EP | 1879363 | 1/2008 |
| JP | H0799403 | 4/1995 |
| JP | 2003037861 | 2/2003 |
| JP | 2005262363 | 9/2005 |
| KR | 20080010693 | 1/2008 |
| KR | 20090116030 | 11/2009 |
| TW | 200836404 | 9/2008 |
| TW | 200843277 | 11/2008 |
| TW | M349050 | 1/2009 |
| TW | 200913370 | 3/2009 |
| TW | 200920078 | 5/2009 |
| TW | I318855 | 12/2009 |
| WO | WO03/001637 | 1/2003 |
| WO | WO2009/126480 | 10/2009 |

* cited by examiner

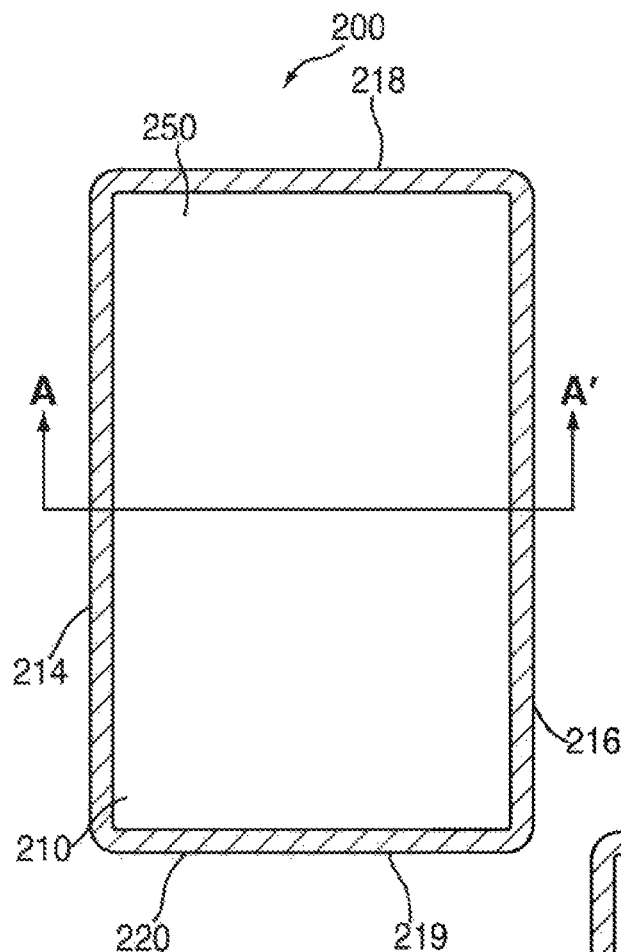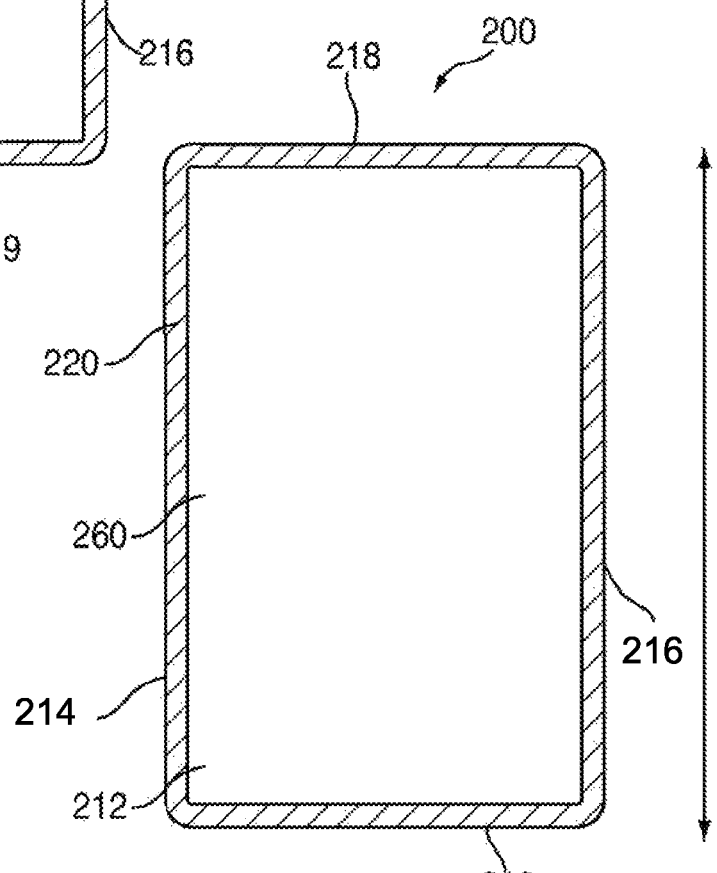

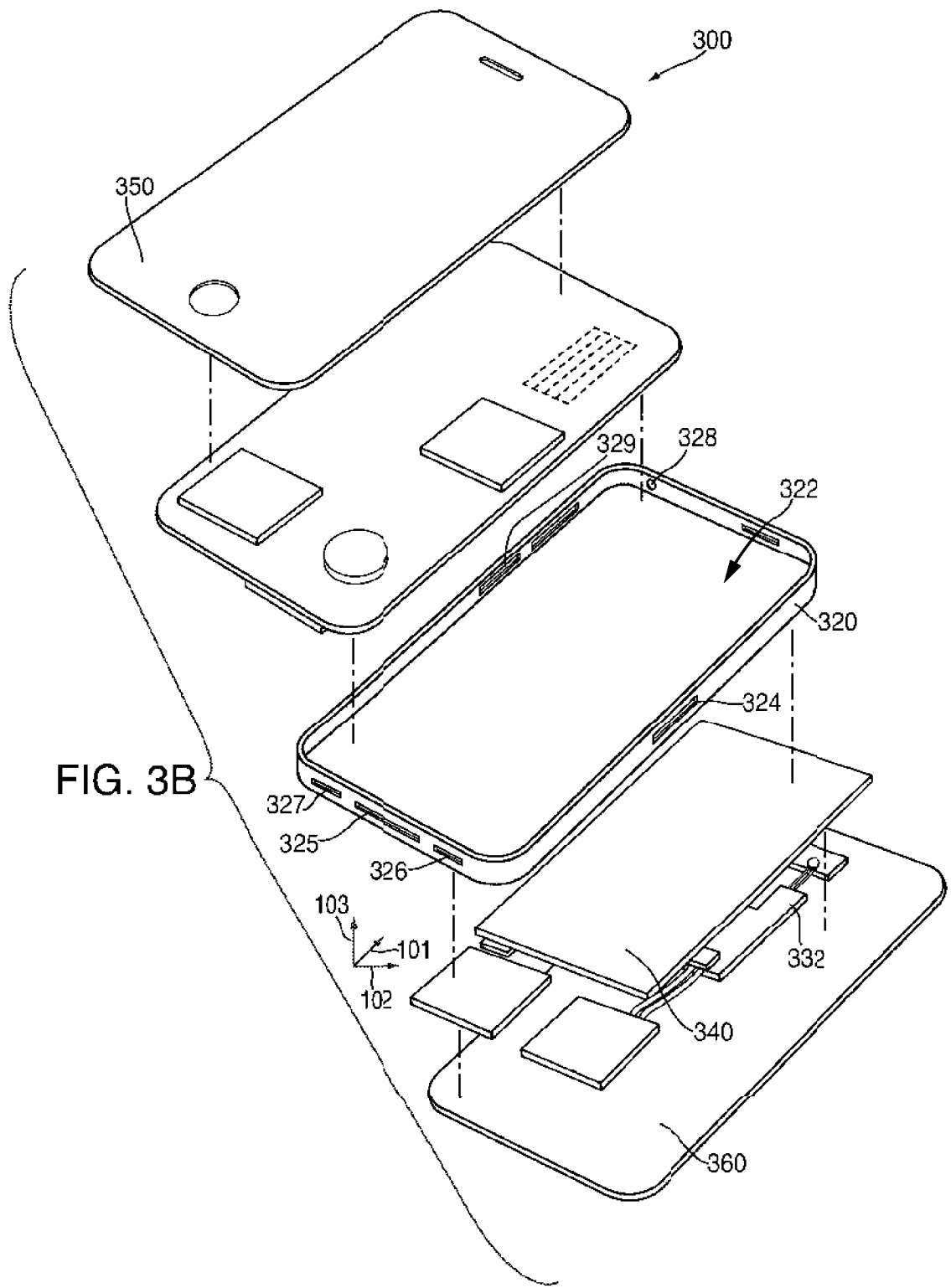

HANDHELD DEVICE ENCLOSURE HAVING AN OUTER PERIPHERY MEMBER AND FRONT AND REAR COVER ASSEMBLIES

CROSS-REFERENCE TO RELATED APPLICATION(S)

This application is a continuation patent application of U.S. patent application Ser. No. 16/405,239, filed May 7, 2019 and titled "Handheld Device Enclosure," which is a continuation patent application of U.S. patent application Ser. No. 15/892,310, filed Feb. 8, 2018 and titled "Handheld Device Enclosure Having Outer Periphery Members and a Front Cover Assembly," now U.S. Pat. No. 10,303,219, which is a continuation patent application of U.S. patent application Ser. No. 15/168,194, May 30, 2016 and titled "Handheld Device Enclosure," now U.S. Pat. No. 9,898,049, which is a continuation patent application of U.S. patent application Ser. No. 14/064,785, filed Oct. 28, 2013 and titled "Handheld Device Enclosure," now U.S. Pat. No. 9,357,665, which is a continuation patent application of U.S. patent application Ser. No. 12/794,529, filed Jun. 4, 2010 and titled "Handheld Device Enclosure," now U.S. Pat. No. 8,576,561, which claims the benefit of U.S. Provisional Patent Application No. 61/300,780, filed Feb. 2, 2010 and titled "Handheld Device Enclosure," U.S. Provisional Patent Application No. 61/325,625, filed Apr. 19, 2010 and titled "Electrically Insulating Connection Between Conductive Components," and U.S. Provisional Patent Application No. 61/325,786, filed Apr. 19, 2010 and titled "Cosmetic Co-Grinding of Electronic Device Surfaces," the disclosures of which are hereby incorporated herein by reference in their entireties.

BACKGROUND

A portable electronic device can be constructed using any suitable approach. For example, a "bucket" type approach can be used in which a first housing component serves as a bucket into which electronic device components are placed, and a second housing component serves as a cover for the bucket. This arrangement secures the electronic device components between the first and second housing components. As a variation of this, some or all of the electronic device components can be assembled into the cover for the bucket, and the cover can subsequently be rotated into the bucket to close the device.

Other known portable electronic devices can be constructed by inserting components into a hollow housing element. For example, an electronic device can be constructed using a tubular structure (e.g., a flattened tube or a hollow rectangular tube) into which electronic device components can be inserted. The electronic device components can be inserted into the tubular structure from one or both ends, and connected within the structure. For example, one or more circuits inserted from opposite ends of the tubular structure can be connected through an opening for a window in the structure. The structure can be capped at one or both ends to ensure that the components remain fixed within the tubular structure, and to provide interface components (e.g., connectors, buttons, or ports) for the device.

SUMMARY

This is directed to an electronic device including an outer periphery member that forms the sides of the electronic device. The outer periphery member can define a volume into which electronic device components can be placed. To retain the components within the device, front and back cover assemblies can be placed over the front and back surfaces of the outer periphery member.

An electronic device enclosure can include several components. In some embodiments, the enclosure can include several elements including angled portions. The elements can be connected to form a closed component (e.g., a loop), such that the component defines an inner volume in which electronic device components can be retained. In some embodiments, an internal structure such as an internal platform can be placed within the component to enhance the structural integrity of the component.

In some embodiments, an electronic device enclosure can include an outer periphery member having an external side surface, a front surface, a back surface, and an internal surface. An internal platform can be connected to the internal surface, and placed within a volume enclosed by the outer periphery member (e.g., between the front and back surfaces of the outer periphery member). The internal platform can define first and second pockets in which electronic device components can be inserted, for example from the front surface or from the back surface of the outer periphery member.

In some embodiments, an electronic device enclosure can include an outer periphery member defining a ring, and within which an internal platform can be placed. The internal platform can be offset from front and back surfaces of the outer periphery member. To prevent components placed within a volume defined by the outer periphery member from being removed from the enclosure, the enclosure can include front and back cover assemblies. The cover assemblies can be placed adjacent to front and back surfaces of the outer periphery member to cover the internal platform.

In some embodiments, an electronic device enclosure can be constructed by providing an outer periphery member and an internal platform. The internal platform can be connected to the outer periphery member such that at least a portion of the internal platform is within a height of the outer periphery member. Electronic device components can be assembled into the electronic device enclosure from two opposite surfaces of the internal platform. In some embodiments, one or more cover assemblies can be assembled over the two opposite surfaces of the internal platform or over two opposite surfaces of the outer periphery member to retain the electronic device components.

BRIEF DESCRIPTION OF THE DRAWINGS

The above and other features of the present invention, its nature and various advantages will be more apparent upon consideration of the following detailed description, taken in conjunction with the accompanying drawings in which:

FIG. 2C is a top view of an illustrative electronic device in accordance with one embodiment of the invention;

FIGS. 2D-2E are bottom views of embodiments of an illustrative electronic device in accordance with one embodiment of the invention;

FIG. 3B is an exploded view of the electronic device of FIG. 3A in accordance with one embodiment of the invention;

DETAILED DESCRIPTION

An electronic device can be provided with mechanical and electrical components for providing different functionality to a user. In some cases, components of an electronic device can be constructed to provide mechanical features that improve the performance, aesthetics, robustness and size of the electronic device.

Electronic devices that may be provided with these components can include desktop computers, computer monitors, computer monitors containing embedded computers, wireless computer cards, wireless adapters, televisions, set-top boxes, gaming consoles, routers, portable electronic devices such as laptop computers, tablet computers, and handheld devices such as cellular telephones and media players, and small devices such as wrist-watch devices, pendant devices, headphone and earpiece devices, and other wearable and miniature devices. Portable devices such as cellular telephones, media players, and other handheld electronic devices are sometimes described herein as an example.

Figure 1:
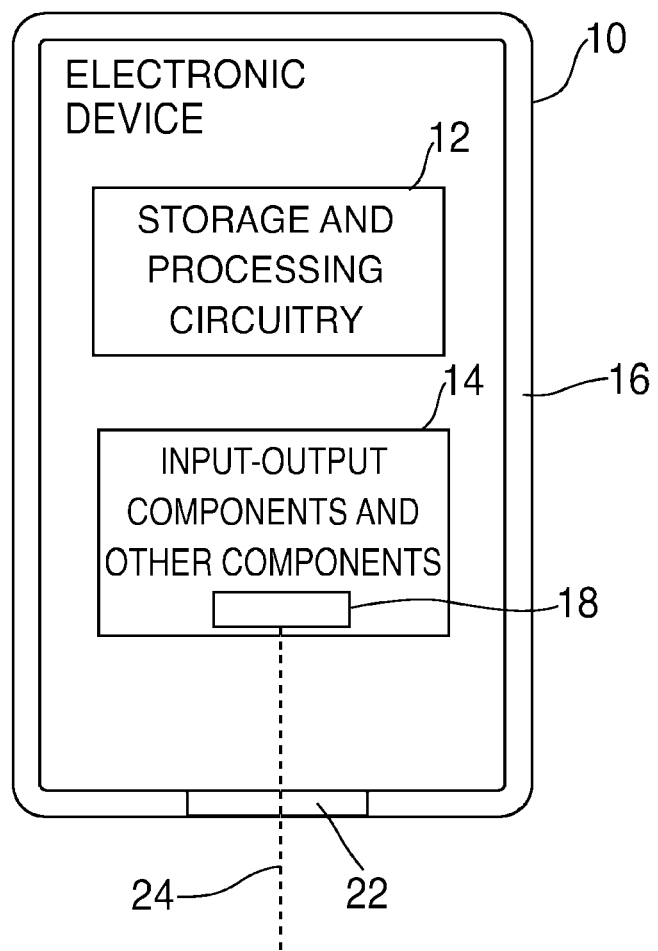
FIG. 1 is a schematic view of an illustrative electronic device that can be provided with mechanical and electrical features in accordance with one embodiment of the invention.

An illustrative electronic device that can be provided with mechanical and electrical features to improve performance, aesthetics, robustness, and size is shown in FIG. 1. As shown in FIG. 1, device 10 can include storage and processing circuitry 12. Storage and processing circuitry 12 can include one or more different types of storage such as hard disk drive storage, nonvolatile memory (e.g., flash memory or other electrically-programmable-read-only memory), volatile memory (e.g., static or dynamic random-access-memory), or combinations of these. Storage and processing circuitry 12 may be used in controlling the operation of device 10. Processing circuitry in circuitry 12 can be based on processors such as microprocessors, microcontrollers, digital signal processors, dedicated processing circuits, power management circuits, audio and video chips, and other suitable integrated circuits.

With one suitable arrangement, storage and processing circuitry 12 can be used to run software on device 10, such as internet browsing applications, voice-over-internet-protocol (VOIP) telephone call applications, email applications, media playback applications, operating system functions, antenna and wireless circuit control functions, or combinations of these. Storage and processing circuitry 12 can be used in implementing suitable communications protocols. Communications protocols that may be implemented using storage and processing circuitry 12 can include internet protocols, wireless local area network protocols (e.g., IEEE 802.11 protocols—sometimes referred to as Wi-Fi®), protocols for other short-range wireless communications links such as the Bluetooth® protocol, protocols for handling cellular telephone communications services, or other such communications protocols.

Input-output devices 14 may be used to allow data to be supplied to device 10 and to allow data to be provided from device 10 to external devices. Examples of input-output devices 14 that may be used in device 10 include display screens such as touch screens (e.g., liquid crystal displays or organic light-emitting diode displays), buttons, joysticks, click wheels, scrolling wheels, touch pads, key pads, keyboards, microphones, speakers and other devices for creating sound, cameras, sensors, or combinations of these. A user can control the operation of device 10 by supplying commands through devices 14 or by supplying commands to device 10 through an accessory that communicates with device 10 through a wireless or wired communications link. Devices 14 or accessories that are in communication with device 10 through a wired or wireless connection may be used to convey visual or sonic information to the user of device 10. Device 10 may include connectors for forming data ports (e.g., for attaching external equipment such as computers, accessories, etc.).

The various components of the electronic device may be surrounded by housing 16. The housing can protect the internal components and may help keep the internal components in their assembled position within device 10. Housing 16 may also help form part of the outer peripheral look and feel of device 10, (e.g., the ornamental appearance). The housing can be widely varied. For example, the housing can include a variety of external components that utilize a variety of different materials. In one example, at least a portion of the housing can include a translucent/transparent portion through which internal components may optically communicate to the outside world.

In accordance with one embodiment, device 10 can include optical system 18. Optical system 18 can include, for example, optical components that work through window or opening 22 in the housing 16. The optical components can, for example, correspond to one or more camera modules. Although situated inside the housing 16, the camera modules may be configured to capture image data outside the device 10 via window 22 by a line of sight that passes through window 22. The optical components can be oriented along axis 24, where the axis is aligned with window 22 to provide the best possible image capture. By way of example, window 22 may be associated with a translucent or transparent portion of the housing. In one embodiment, the device 10 can include one or more alignment structures for ensuring proper mounting and operation of optical system 18 relative to the housing 16.

Figure 2A:
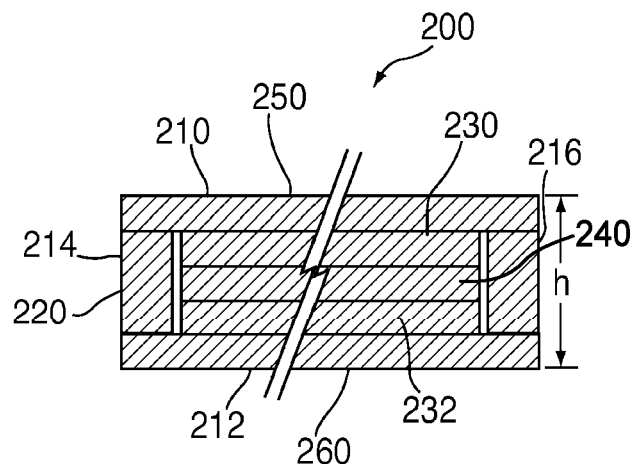
FIG. 2A is a cross-sectional view of an illustrative electronic device structure taken along the device width in accordance with one embodiment of the invention.
Figure 2B:
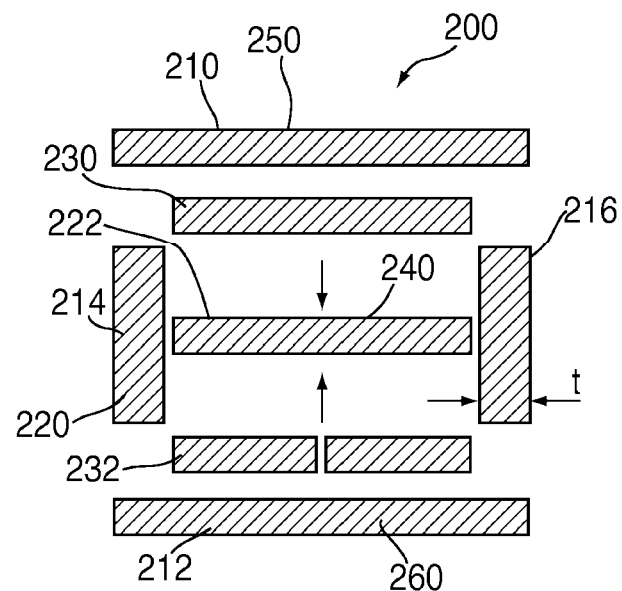
FIG. 2B is an exploded cross-sectional view of an illustrative electronic device taken along the device length in accordance with one embodiment of the invention.
Figure 2E:
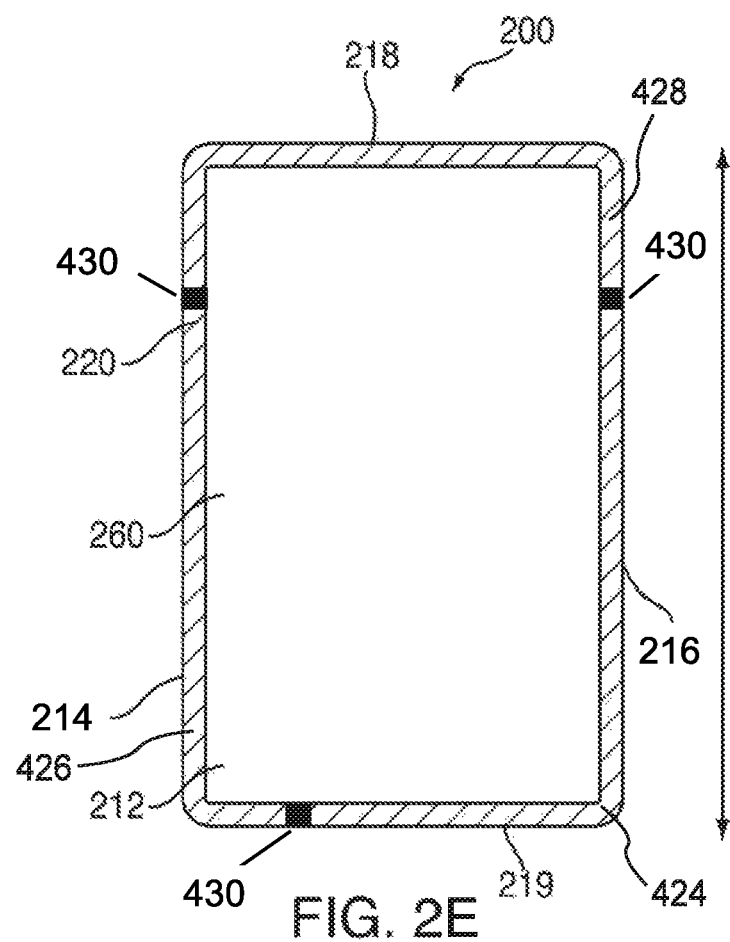

A housing member of an electronic device can provide a variety of attributes to the electronic device including, for example, structural attributes, functional attributes, cosmetic attributes, or combinations of these. In some cases, a housing member can form an external component of the electronic device, and therefore provide the mechanical structure for the device. A housing member can be provided in any suitable form. In some embodiments, the housing member can include an outer periphery member. FIG. 2A is a cross-sectional view of an illustrative electronic device structure having an outer periphery member taken along the device width in accordance with one embodiment of the invention. FIG. 2B is an exploded cross-sectional view of an illustrative electronic device having an outer periphery member taken along the device length in accordance with one embodiment of the invention. FIG. 2C is a top view of an illustrative electronic device having an outer periphery member in accordance with one embodiment of the invention. FIGS. 2D and 2E are bottom views of various embodiments of an illustrative electronic device having an outer periphery member in accordance with one embodiment of the invention. Electronic device 200 can include any suitable type of electronic device, including for example one or more of the types of electronic devices described above in connection with device 10 (FIG. 1).

Electronic device 200 can have any suitable shape, including for example a shape delimited by front surface 210, back surface 212, left surface 214, right surface 216, top surface 218 and bottom surface 219 (not shown in the cross-sections of FIGS. 2A and 2B). Each surface can be substantially planar, curved, or combinations of these. The surfaces can include one or more chamfers, detents, openings, dips, extensions, or other features modifying the smoothness of the surfaces.

Electronic device 200 can be constructed using any suitable structure, including for example using outer periphery member 220. Outer periphery member 220 can form a loop that surrounds or wraps around some or all of the electronic device. The loop formed by outer periphery member 220 can define internal volume 222 into which electronic device components can be placed. For example, outer periphery member 220 can wrap around the device such that the external surfaces of outer periphery member 220 define some or all of left surface 214, right surface 216, top surface 218 and bottom surface 219 of the device. To provide a desired functionality to a user, the electronic device can include several components placed within the device, for example within volume 222.

The outer periphery member can have a particular height (e.g., the device height h) that serves to define an amount of volume 222. In particular, volume 222, or individual measurable quantities of outer periphery member 220 (e.g., height, thickness, length, or width) can be selected to provide at least a minimum volume amount required for receiving and securing electronic device components. In some embodiments, other criteria can instead or in addition drive the measurable quantities of outer periphery member 220. For example, the thickness (e.g., outer periphery member thickness t), length (e.g., device length 1), height (e.g., device height h), and cross-section of the outer periphery member can be selected based on structural requirements (e.g., stiffness, or resistance to bending, compression, tension or torsion in particular orientations). As another example, the measurable quantities of outer periphery member 220 can be selected based on a desired device size or shape, for example driven by industrial design considerations.

In some embodiments, the outer periphery member can serve as a structural member to which other electronic device components can be mounted. In particular, it may be desirable to secure individual electronic device components placed within the device to ensure that the components do not move and break, which could adversely affect the functionality of the device. Outer periphery member 220 can include any suitable feature for securing a device component. For example, the outer periphery member can include one or more depressions, recesses, channels, protrusions, or openings for receiving or engaging electronic device components. In some embodiments, the outer periphery member can instead or in addition include features for retaining internal structural device components to which other components can be secured. For example, an internal structure such as an internal platform (described below in more detail) can be coupled to an internal surface of the outer periphery member, such that other electrical components can be mounted to the internal platform. In some embodiments, the outer periphery member can include one or more openings to provide access to one or more internal components retained within volume 222.

Outer periphery member 220 (or device 200) can have any suitable cross-section. For example, outer periphery member 220 can have a substantially rectangular cross-section. In some embodiments, outer periphery member 220 can instead or in addition have a cross-section in a different shape, including for example a circular, oval, polygonal, or curved cross-section. In some embodiments, the shape or size of the cross-section can vary along the length or width of the device (e.g., an hourglass shaped cross-section).

Outer periphery member 220 can be constructed using any suitable approach. In some embodiments, outer periphery member 220 can be constructed by connecting several distinct elements together. For example, outer periphery member 220 can be constructed by connecting three distinct elements together (e.g. 424, 426 and 428). The elements can be formed from any suitable material, including for example a metal. In particular, the elements can be included in one or more electrical circuits (e.g., as part of an antenna assembly, or as a heart-rate monitor). The individual elements can be formed using any suitable approach. In some embodiments, an element can be formed using cold work. In some embodiments, an element can instead or in addition be formed using a forging process, an annealing process, a machining process, or any other suitable process or combination of processes. In some embodiments, individual elements can be connected to each other or to other electronic device components using a braising process (e.g., to connect a ceramic material to an individual component serving as part of an antenna). It should be appreciated that the gaps or breaks between each adjacent element 424, 426 and 428 may be smaller than shown in FIGS. 2E and/or 4B, which emphasize the breaks for clarity.

The individual elements of the outer periphery member can be connected together using any suitable approach. In some embodiments, a fastener or adhesive can be used to connect the individual elements. In some embodiments, intermediate elements 430 can instead or in addition be placed between adjacent individual elements to securely connect the individual elements together. For example, an intermediate element 430 can be formed from a material that can change from a first state to a second state. In the first state, the material of the intermediate element 430 can flow in a gap between adjacent individual elements. In the second state, the material can adhere to the adjacent individual elements, and provide a structural bond between the individual elements such that the individual elements and the intermediate element 430 form an integral component. For example, the intermediate element 430 can be constructed from a plastic material.

In some embodiments, the individual elements can be formed from a conductive material, while the intermediate elements 430 can be formed from an insulating or dielectric material. This can ensure that different electrical circuits that include individual elements do not interfere with one another. In addition, the dielectric material in gaps between individual elements can help control capacitance, radio frequency energy, and other electrical transfers across the gaps.

Connecting individual elements together using an intermediate element 430 can create artifacts or other imperfections along the interfaces between the individual elements and the intermediate element 430. For example, excess material of the intermediate element 430 can flash or spill beyond a boundary of the interface, and onto an external surface of one of the individual elements. To ensure that the resulting component is aesthetically pleasing and satisfies industrial design requirements, the component can be processed to remove excess material from one or more of the individual elements and the intermediate element. For example, a single process or tool can be used to finish the different elements. The single process can be applied at a single setting including, for example, a setting corresponding to the softest material of the individual elements and intermediate element used to form the component. In some cases, the process can instead or in addition dynamically adjust the manner in which the process is applied based on the material or element being processed. For example, the force, speed or tool type used can vary based on the element being processed. The resulting component can include a continuous surface across an interface between an individual element and an intermediate element. For example, the resulting component can include a smooth surface across a seam between two elements.

Electronic device components can be placed within volume 222 using any suitable approach. For example, electronic device 200 can include components 230 and 232 inserted into volume 222. Each of components 230 and 232 can include individual components, or several components assembled together as a component layer or stack, or include several distinct layers of components to insert within volume 222. In some embodiments, components 230 and 232 can each represent several components stacked along the height of the device. The component layers can be electrically coupled to each other to enable data and power transfers, as required for the proper operation of electronic device 200. For example, the component layers can be electrically coupled using one or more of a PCB, flex, solder, SMT, wires, connectors, or combinations of these. The component layers can be inserted into outer periphery member 220 using any suitable approach. For example, components 230 and 232 can all be inserted from front surface 210 or from back surface 212 (e.g., back to front, front to back, or middle to front and back). Alternatively, the components can be inserted from both front surface 210 and back surface 212.

In some embodiments, one or more of the components can serve as a structural element. Alternatively, electronic device 200 can include a distinct structural element placed within volume 222 and coupled to outer periphery member 220. For example, electronic device 200 can include one or more internal members or platforms 240, which can serve as a mounting points or regions for helping secure, hold or pack one or more component layers (e.g., attaching component 230 to the back surface of internal platform 240, and component 232 to the front surface of internal platform 240). Internal platform 240 can be coupled to outer periphery member 220 using any suitable approach, including for example using snaps, fasteners, flexures, welds, glue, or combinations of these. Alternatively, internal platform 240 may even be part of the outer periphery member (e.g., machined, extruded, or cast, or integrally formed as a single unit). The internal platform can have any suitable size, including for example a size that is smaller than the internal volume of outer periphery member 220.

Internal platform 240 can be positioned at any suitable height within outer periphery member 220, including for example substantially at half the height of outer periphery member 220. The resulting structure (e.g., outer periphery member 220 and internal platform 240) can form an H-shaped structure that provides sufficient stiffness and resistance to tension, compression, torsion and bending.

The internal platform, inner surfaces of the outer periphery members, or both can include one or more protrusions, depressions, shelves, recesses, channels, or other features for receiving or retaining electronic device components. In some cases, the internal platform, outer periphery member or both can include one or more openings for coupling components located in the front and back regions of internal platform 240. The size of each region can be selected based on any suitable criteria, including for example operational needs of system, numbers and types of electrical components in the device, manufacturing constraints of the internal platform, or combinations of these. The internal platform can be constructed as a distinct component from any suitable material (e.g., plastic, metal or both), or instead defined from an existing electronic device component placed within the volume defined by the outer periphery member. For example, the internal platform can be formed by a printed circuit board or chip used by the device.

In some embodiments, internal platform 240 can include one or more electrically conductive elements for providing electrical connections between the components. For example, internal platform 240 can include one or more PCB, flex, wire, solder pad, cable, connector, or other electrically conductive mechanism for connecting components within the device.

Electronic device 200 can include front cover assembly 250 and back cover assembly 260 defining the front and back surfaces, respectively, of device 200. The front and back cover assemblies can include one or more components, or can include at least a front member and a back member that form some or all of the outer front and back surfaces of the device. Front and back cover assemblies 250 and 260 can be flush, recessed or protruding relative to the front and back surfaces of outer periphery member 220. In the example of FIGS. 2A and 2B, front cover assembly 250 and back cover assembly 260 can be proud or protrude above front and back edges of outer periphery member 220 (e.g., such than an interior surface of the cover assemblies is flush with a front or back surface of the outer periphery member).

Alternatively, one or both of the cover assemblies can be flush or sub flush relative to the outer periphery member, for example to prevent edges from engaging other surfaces (e.g., at least a portion of the cover assemblies can be included within volume 222). In some embodiments, one or both of front cover assembly 250 and back cover assembly 260 can include one or more windows. Any suitable information or content can pass through the windows. For example, a cover assembly can include a window through which a camera can capture images. As another example, a cover assembly can include a window through which content provided by a display may be made available, or through which light (e.g., from a flash) can be provided.

In some embodiments, different components of the electronic device can be substantially made of glass. For example, portions of the electronic device housing can have at least 75% of its exterior as glass. In one implementation, one or both of the cover assemblies can include a glass element providing a substantial portion of the cover assembly. In particular, the front and back surfaces of the device can include substantial amounts of glass, while left, right, top and bottom surfaces of the device can include substantial amounts of a metal (e.g., steel).

In some embodiments, the housing of a portable electronic device can be banged or rub against various surfaces. When plastic or softer metal housing surfaces are used, the surfaces can tend to become scratched. On the other hand, glass housing surfaces (e.g., glass cover assemblies) can be more scratch resistant. Moreover, glass housing surfaces can offer radio transparency, while metal housing surfaces can disturb or hinder radio communications. In one embodiment, an electronic device housing can use glass housing members (e.g., glass cover assemblies) for a front surface and a back surface of the electronic device housing. For example, a front surface formed from a glass housing member can be transparent to provide visual access to a display device positioned behind the glass housing member at the front surface, while a back surface formed from a glass housing member can be transparent or non-transparent. Non-transparency, if desired, can conceal any interior components within the electronic device housing. In one embodiment, a surface coating or film can be applied to the glass housing member to provide non-transparency or at least partial translucency. Such a surface coating or film can be provided on an inner surface or an outer surface of the glass housing member.

Figure 3A:
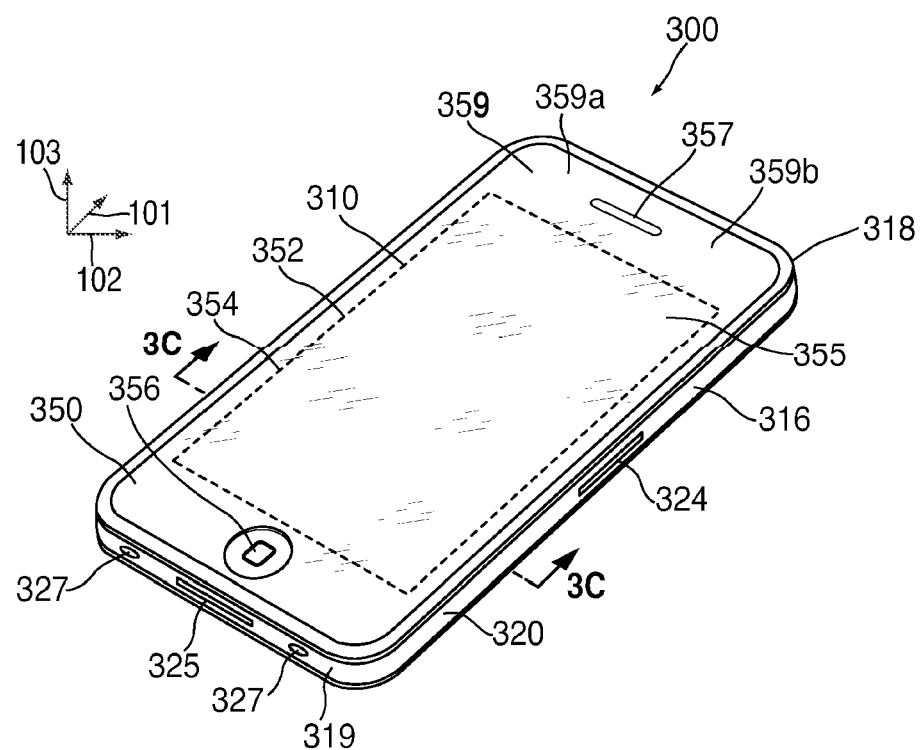
FIG. 3A is a schematic perspective view of an illustrative electronic device in accordance with one embodiment of the invention.
Figure 3C:
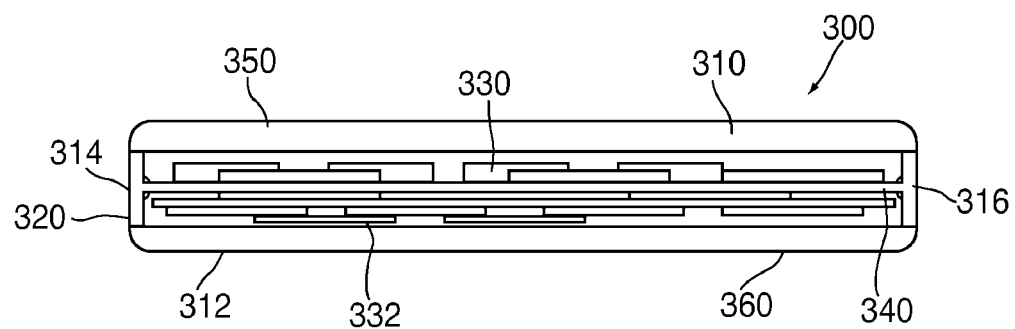
FIG. 3C is a cross-sectional view of the electronic device of FIG. 3A in accordance with one embodiment of the invention.

FIG. 3A is a schematic perspective view of an illustrative electronic device in accordance with one embodiment of the invention. FIG. 3B is an exploded view of the electronic device of FIG. 3A in accordance with one embodiment of the invention. FIG. 3C is a cross-sectional view of the electronic device of FIG. 3A in accordance with one embodiment of the invention. The electronic device of FIGS. 3A-3C can include some or all of the features of the electronic device of FIGS. 2A-2D. In particular, components having similar numbers can share some or all features. Outer periphery member 320 can surround the periphery of electronic device 300 to form some or all of the outer-most side, top and bottom surfaces (e.g., front surface 310, back surface 312, left surface 314, right surface 316, top surface 318 and bottom surface 319) of the electronic device. Outer periphery member 320 can have any suitable shape, including for example one or more elements that can be combined to form a ring. The ring-shape of outer periphery member 320 can enclose volume 322 in which electronic device components can be assembled and retained. The shape of outer periphery member 320 can define the boundaries of volume 322, and therefore can be determined based on the size and type of components placed within volume 322. The boundaries of volume 322 (e.g., determined by the shape of outer periphery member 320) can have any suitable shape, including for example a substantially rectangular shape (e.g., having straight or rounded edges or corners), a circular shape, an oval shape, a polygonal shape, or any other closed shape that can define a volume.

Outer periphery member 320 can have any suitable size, which can be determined based on any suitable criteria (e.g., aesthetics or industrial design, structural considerations, components requires for a desired functionality, or product design). For example, outer periphery member 320 can have a length (e.g., along axis 101) in the range of 70 mm to 150 mm, such as 80 mm to 140 mm, 90 mm to 130 mm, 100 mm to 120 mm, or 105 mm to 115 mm, or any other sub-range within the range of 70 mm to 150 mm. As another example, outer periphery member 320 can have a width (e.g., along axis 102) in the range of 40 mm to 85 mm, such as 50 mm to 75 mm, 55 mm to 65 mm, or any other sub-range within the range of 40 mm to 85 mm. As still another example, outer periphery member 320 can have a height (e.g., along axis 103) in the range of 4 mm to 15 mm, such as 5 mm to 14 mm, 6 mm to 13 mm, 7 mm to 12 mm, 8 mm to 11 mm, 9 mm to 10 mm, or any other sub-range within the range of 4 mm to 15 mm.

The outer periphery member can have any suitable cross-section, including for example a variable cross-section or a constant cross-section. In some embodiments, the cross-section of the ring can be selected based on desired structural properties for the outer periphery member. For example, the cross-section of outer periphery member 320 can be substantially rectangular, such that the height of the outer periphery member is substantially larger than the width of the outer periphery member. This can provide structural stiffness in compression and tension, as well as bending. In some embodiments, the dimensions of the outer periphery member cross-section can be determined relative to the dimensions of the internal platform cross section. For example, the outer periphery member height can be in a range of 5 to 15 times the height of the internal platform, for example 8 to 12 times, 9 to 11 times, or approximately 10 times the height of the internal platform. In one implementation, the height of the outer periphery member can be approximately 9 mm, and the height of the internal platform can be approximately 0.9 mm.

As another example, the width of the outer periphery member can be in a range of 8 to 25 times the width of the internal platform, for example 12 to 20 times, 15 to 18 times, or approximately 16 times the internal platform width. For example, the width of the outer periphery member can be 3 mm and the width of the internal member can be 50 mm. In some embodiments, the height of the internal platform can be related to the width of the outer periphery member. For example, the width of the outer periphery member can be 1 to 8 times the height of the internal platform, such as 2 to 6 times or approximately 4 times the height of the internal platform. In one implementation, the height of the internal platform can be approximately 0.7 mm and the width of the outer periphery member can be approximately 2.5 mm. In some embodiments, the height of the outer periphery member can be related to the width of the internal platform. For example, the width of the internal platform can be 3 to 10 times the height of the outer periphery member, such as 4 to 8 times, 5 to 7 times, or approximately 6 times the height of the outer periphery member. For example, the width of the internal platform can be approximately 5.5 mm and the height of the outer periphery member can be approximately 0.9 mm.

In some embodiments, outer periphery member 320 can include one or more openings, knobs, extensions, flanges, chamfers, or other features for receiving components or elements of the device. The features of the outer periphery member can extend from any surface of the outer periphery member, including for example from internal surfaces (e.g., to retain internal components or component layers), or from external surfaces. In particular, outer periphery member 320 can include a slot or opening 324 for receiving a card or tray within the device. Opening 324 can be aligned with one or more internal components operative to receive and connect to an inserted component (e.g., an inserted SIM card). As another example, outer periphery member 320 can include connector opening 325 (e.g., for a 30-pin connector) through which a connector can engage one or more conductive pins of electronic device 300. Outer periphery member 320 can include openings 326 and 327 for providing audio to a user (e.g., an opening adjacent to a speaker), or receiving audio from a user (e.g., an opening adjacent to a microphone). Outer periphery member 320 can instead or in addition include an opening for an audio connector or power supply (e.g., opening 328), or features 329 for retaining and enabling a button such as a volume control or silencing switch.

The various features of outer periphery member 320 can be constructed using any suitable approach and at any suitable time. In some embodiments, the features can be constructed as part of a process that creates outer periphery member 320 from a single piece of material that is manufactured into the final shape of outer periphery member 320 (e.g., using a machining process). In some embodiments, several pieces of material can instead or in addition be shaped individually and combined into outer periphery member 320. For example, several angled elements (e.g., two elements with sections having substantially 90 degree angles, and one element with two sections each having a 90 degree angle) can be connected together to form a closed component (e.g., a loop). The various features can then be created as part of each individual piece, or once the entire outer periphery member has been assembled. Outer periphery member 320 can be constructed from any suitable material, including for example a metal (e.g., steel or aluminum), plastic (e.g. polyurethane, polyethylene or polycarbonate), composite material, or any combination thereof. In some embodiments, outer periphery member 320 can be constructed from the combination of several materials.

In some embodiments, outer periphery member 320 can have a functional use or purpose in addition to serving as a cosmetic component or as a structural component. For example, outer periphery member 320 can be used as part of an antenna for capturing electromagnetic waves radiated by or in a communications network. In some cases, outer periphery member 320 can be used as parts of more than one antenna.

In some embodiments, one or more portions of outer periphery member 320 can be treated to provide an aesthetically pleasing component. In particular, left surface 314, right surface 316, top surface 318, and bottom surface 319 can be treated using a cosmetic surface treatment such as, for example, polishing, coating (e.g., using a dye or coloring material, or a material providing an optical effect), glazing, thin film deposition, grinding, superfinishing, or any other suitable process. In some embodiments, front or back surfaces of outer periphery member 320 can instead or in addition be provided with a cosmetic treatment (e.g., for regions of the outer periphery member that may not be covered by back and front cover assemblies 350 and 360).

To reduce the overall weight, size or both of electronic device 300, the thickness of outer periphery member 320 can be selected such that outer periphery member 320 is only minimally resistant to one or more of bending, torsion, tension, compression, or other deformation of the band. For example, outer periphery member 320 can be more resistant to tension and compression, but less resistant to bending or torsion. To provide sufficient resistance to all types of deformation, electronic device 300 can include a structural component placed within volume 322. In some embodiments, one or more of the internal components of the electronic device can be connected to the outer periphery member and serve as a structural component. For example, a circuit board (with or without a separate stiffening element) can be connected to opposite portions of outer periphery member 320. Alternatively, a distinct and dedicated structural component can be coupled to outer periphery member 320. In the example of FIGS. 3A-3C, electronic device 300 can include internal platform 340 forming a distinct structural component of the electronic device. Internal platform 340 can include any suitable shape, including for example a substantially planar shape. In some embodiments, internal platform 340 can include several distinct regions, such as a primary region and step regions extending from the primary region to engage one or more features of outer periphery member 320. An internal platform such as internal platform 340 is described in more detail in connection with FIGS. 4A-4B.

Figure 4A:
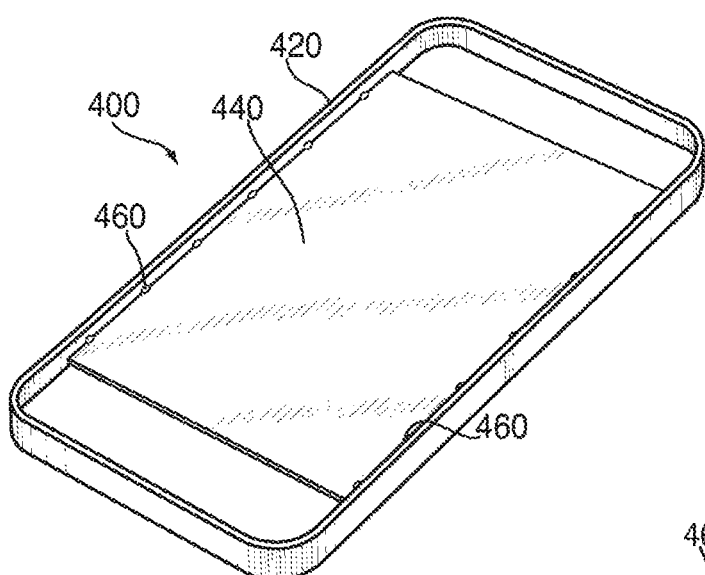
FIG. 4A is a schematic view of an illustrative internal platform coupled to an outer periphery member in accordance with one embodiment of the invention.
Figure 4B:
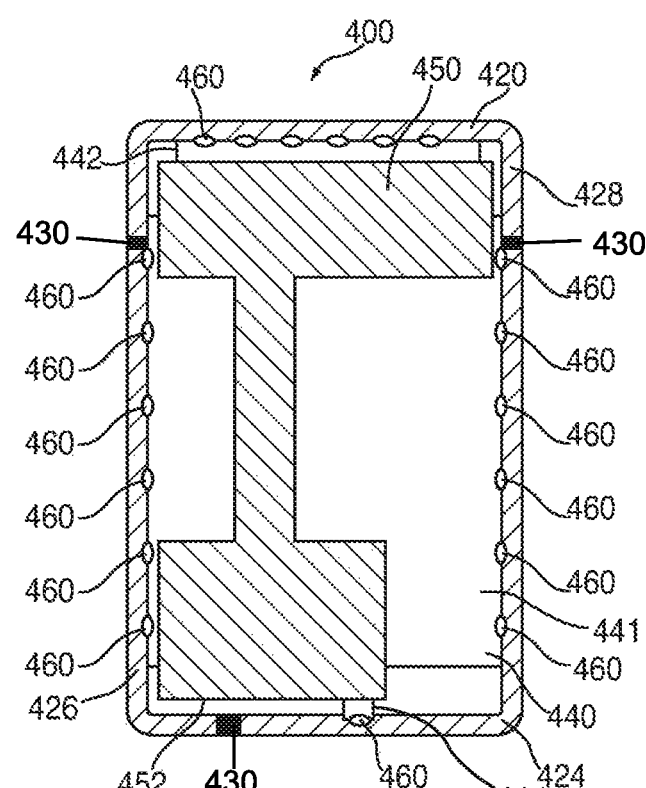
FIG. 4B is a top view of an illustrative internal platform coupled to an outer periphery member in accordance with one embodiment of the invention.
Figure 4C:
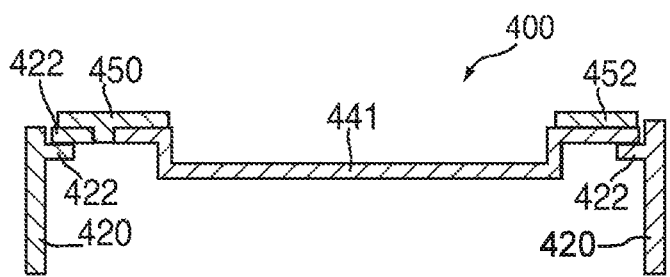
FIG. 4C is a cross-sectional view of an illustrative internal platform assembled to an outer periphery member in accordance with one embodiment of the invention.

FIG. 4A is a schematic view of an illustrative internal platform coupled to an outer periphery member in accordance with one embodiment of the invention. FIG. 4B is a top view of an illustrative internal platform coupled to an outer periphery member in accordance with one embodiment of the invention. FIG. 4C is a cross-sectional view of an illustrative internal platform coupled to an outer periphery member in accordance with one embodiment of the invention. Device housing 400 can include outer periphery member 420 to which internal platform 440 is coupled. The outer periphery member and internal platform can include some or all of the features described above with respect to the devices of FIGS. 2A-2E and 3A-3C. In particular, internal platform 440 can include some or all of the features described above in connection with internal platform 340.

Internal platform 440 can be constructed using any suitable approach. In some embodiments, internal platform 440 can be constructed from a single element or as a combination of several elements. Internal platform 440 can be placed within an electronic device to support or retain electrical components. Internal platform 440 can include several distinct conductive plates (e.g., metal plates), including base plate 441, top step 442, and bottom step 444. The plate and steps can have any suitable size including, for example, a large plate cover a substantial portion of the area enclosed by an outer periphery member (e.g., 40%, 50%, 60%, 70%, 80% or 90%). Alternatively, the entire internal platform 440 can cover only a portion of the area enclosed by an outer periphery member (e.g., 60%, 70%, 80%, 90%, or more). The steps can be substantially smaller than the plate including, for example, serving as tabs to ground portions of internal platform 440.

Each of the plates and steps can be constructed from the same or different material including, for example, from a same conductive material (e.g., from a metal). In some embodiments, one or more of the steps can be incorporated in the same piece of material used to form the plate. For example, step 444 can include a stepped-up region of plate 441. Alternatively, a step can be constructed from a different piece of material than the plate. For example, step 442 can be constructed from a different piece of material that plate 441. Plate 441 and steps 442 and 444 can be placed in the same or different planes. In one implementation, base plate 441 can be placed at a first level, while steps 442 and 444 can be offset relative to base plate 441 (e.g., stepped up towards the front surface of the device). Steps 442 and 444 can be stepped by any suitable amount including, for example, a substantially identical amount (e.g., such that steps 442 and 444 are substantially in the same plane). For example, steps 442 and 444 can be positioned such that the front surfaces of the step are flush or slightly sub flush relative to a front surface of outer periphery member 420, to which the steps are connected. Breaks in internal platform 440 for distinguishing between plate 441 and steps 442 and 444 can be provided at any suitable position. For example, the breaks can be located as part of the stepped up surface, as the step, or on the plate. In some embodiments, the distinction between a plate and step can be arbitrary because the step and plate are constructed from a single piece of material.

Plate 441 and steps 442 and 444 can be at least partially electrically isolated to ensure that elements of an outer periphery member remain electrically isolated (e.g., to guarantee antenna performance). For example, step 442 can be connected to plate 441, or to a stepped up portion of plate 441 using connecting element 450. Connecting element 450 can be constructed from any suitable material, including for example a suitable insulating material (e.g., plastic injection molded between step 442 and plate 441). As another example, step 444 can be incorporated as part of the piece of material used to form plate 441, and can therefore be electrically connected to the plate. Step 444 can include connecting element 452 placed on a front surface of the step, for example mirroring connecting element 450. In particular, connecting elements 450 and 452 can be positioned to extend forward from a front surface of outer periphery member 420. Connecting elements 450 and 452 can be provided using any suitable approach, including for example by molding material (e.g., plastic) between the plate and the steps, or on a surface of one or more of the plate and steps. Connecting elements 450 and 452 can have any suitable shape including, for example, a planar shape or a three-dimensional shape (e.g., including a step to connect plate 441 to one or more of steps 442 and 444 positioned in different planes). Elements 450 and 452 can form distinct elements, or can instead be different portions of a continuous element. In some embodiments, connecting elements 450 and 452 can be connected to the outer periphery member in a manner that electrically isolates different sections of plate 441 (e.g., as shown, for example, in FIG. 4B). Alternatively, connecting elements 450 and 452 can be provided in a manner to electrically insulate different sections of outer periphery member 420 (e.g., insulate elements 424 and 426, but only in the vicinity of step 444, as required for antenna performance).

Internal platform 440 can be coupled to outer periphery member 420 using any suitable approach. In some embodiments, portions of plate 441 and steps 442 and 444 can extend beyond the edges of connecting elements 450 and 452 so that the internal platform can be coupled to the outer periphery member via the plate and steps (e.g., the metal elements of the internal platform can be coupled to the metal outer periphery member for grounding or antenna performance). For example, exposed metal surfaces of plate 441 and steps 442 and 444 can be coupled to outer periphery member 420 using welding, soldering, or any other connection process that maintains conductivity. Alternatively, one or more of heat staking, an adhesive, tape, a fastener, or other non-conductive connection processes can be used. When a conductive process is used, such as welds 460 (e.g., laser welds), the welds can be distributed such that the outer periphery member elements that are to remain electrically isolated remain isolated. In particular, welds 460 along plate 441 can be positioned such that small L-shaped element 426 is electrically isolated from large L-shaped element 424 and U-shaped element 428. Alternatively, if it is important for small shaped element 426 and large shaped element 424 to be electrically insulated only in the vicinity of the interface between the elements, welds 460 can be distributed such that an electrically conductive path exists between elements 424 and 426 through plate 441, and not through step 444.

Internal platform 440 can be coupled to any suitable portion of outer periphery member 420. For example, internal platform 440 can be assembled within the height of outer periphery member 420 (e.g., based on the position of contact points or regions of the outer periphery member). The distribution of the contact points can be selected based on structural considerations including, for example, based on a desired resistance to torsion, bending, or other mechanical forces. In particular, the electronic device can include at least four contact points or regions distributed within outer periphery member 420 (e.g., near corners of the outer periphery member). As another example, internal platform 440 can include contact regions along the straight portions of outer periphery member 420 (e.g., along the edges of plate 441). As still another example, stepped regions of internal platform 440 (e.g., steps 442 and 444) can be coupled to or near the front or back surfaces of outer periphery member 420 (e.g., on opposite portions of the front or back surfaces) such that portions of steps 442 and 444 (e.g., connecting elements 450 and 452) extend beyond a front surface of outer periphery member 420, while plate 441 does not. In some embodiments, outer periphery member 420 can include one or more tabs or extensions for supporting internal platform 440 (e.g., tabs on which the platform is soldered or welded). For example, outer periphery member 420 can include tabs 422 for supporting internal platform 440 when it is inserted within the outer periphery member.

In some embodiments, internal platform 440 can be placed within the height of outer periphery member 420 such that components can be placed on both the front and back surfaces of internal platform 440. For example, some components can be inserted from a back surface, and some components can be inserted from a front surface. The components can be coupled to an internal platform for security, and can instead or in addition be electrically connected to each other through an opening in or around a periphery of the internal platform. In some embodiments, some components can first be coupled to back and front cover assemblies placed over the front and back surfaces of the outer periphery member, respectively, before being inserted in an internal volume enclosed by outer periphery member 420 and coupled to the outer periphery member. In effect, by its position, internal platform 440 can define back and front pockets or regions within the volume in which electronic device components can be placed. The size of each pocket or region can be determined based on any suitable criteria including, for example, the number and size of components to place in each region, the required position of internal platform 440 relative to the outer periphery member (e.g., if available positions are limited due to structural requirements), or combinations of these. For example, a front pocket can be used for display circuitry and a touch interface, while a back pocket can be used for processing circuitry, a battery, connector interfaces, and an input interface.

The components can be coupled to internal platform 440 for security, and can instead, or in addition, be electrically connected to each other through an opening in internal platform 440. Internal platform 440 can include any suitable feature for securing or connecting electronic device components, such as one or more snaps, prongs, chamfers, extends, openings, access points, doors, or combinations of these. In some cases, internal platform 440 can include one or more dedicated features for receiving or securing specific electrical components, such as speakers, microphones, audio jacks, cameras, light sources, chips, or combinations of these. In addition, internal platform 440 can include one or more electronic components, including for example connectors and conductive paths for electrically connecting to electronic device components, and for transferring data, power, or both between electronic device components.

Returning to FIGS. 3A-3C, to retain components within volume 332, electronic device 300 can include back cover assembly 360 and front cover assembly 350 providing the back and front surfaces of the electronic device, respectively. Each cover assembly can be coupled to outer periphery member 320 using any suitable approach, including for example using an adhesive, tape, mechanical fastener, hooks, tabs, or combinations thereof. In some embodiments, one or both of cover assemblies 350 and 360 can be removable, for example for servicing or replacing electronic device components (e.g., a battery). In some embodiments, front and back cover assemblies 350 and 360 can include several distinct parts, including for example a fixed part and a removable part. The inner surfaces of front cover assembly 350 and back cover assembly 360 can include any suitable feature, including for example one or more ridges, hooks, tabs, extensions, or any combination thereof for retaining the covers or ensuring proper alignment of the covers on outer periphery member 320. The features of front and back cover assemblies 350 and 360 can interact with corresponding features of outer periphery member 320 or other components of the electronic device to ensure proper placement of the covers.

Figure 5:
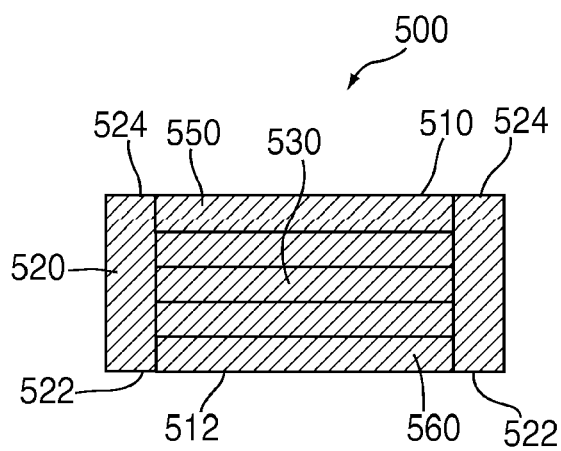
FIG. 5 is a cross-sectional view of an illustrative electronic device assembly in accordance with one embodiment of the invention.

Back cover assembly 360 and front cover assembly 350 can be positioned in any suitable manner relative to outer periphery member 320. FIG. 5 is a cross-sectional view of an illustrative electronic device assembly in accordance with one embodiment of the invention. Electronic device 500 can include outer periphery member 520 having some or all of the features of outer periphery member 220 (FIGS. 2A-2E). In particular, outer periphery member 520 can include one or more features for retaining internal components of the device (e.g. component 530). The front and back surfaces of electronic device 500 can be provided by in part by front cover assembly 550 and back cover assembly 560, and in part by front and back exposed surfaces of outer periphery member 520. In particular, front cover assembly 550 and back cover assembly 560 can be recessed within outer periphery member 520, for example to protect components of the cover assemblies from damage due to impacts along the front or back surfaces. Front cover assembly 550 and back cover assembly 560 can include some or all of the features of back cover assembly 260 and front cover assembly 250 (FIGS. 2A-2E).

Front cover assembly 550 and back cover assembly 560 can be coupled to any suitable portion of outer periphery member 520. In some embodiments, front cover assembly 550 and back cover assembly 560 can be connected relative to outer periphery member 520 in the same or different manners. In the example of electronic device 500, both front cover assembly 550 and back cover assembly 560 can be recessed within the front and back surfaces, respectively, of outer periphery member 520. In particular, front cover assembly 550 can cover none or only some of front surface 524 of outer periphery member 520 such that both outer periphery member 520 and front cover assembly 550 define front surface 510 of electronic device 500. Similarly, back cover assembly 560 can cover none or some of back surface 522 of outer periphery member 520 such that back cover assembly 560 defines some or all of back surface 512 of electronic device 500. The resulting height of electronic device 500 can then be limited to the height of outer periphery member 520 (e.g., in contrast to the embodiment described in connection with FIGS. 2A-2E, where the height of device 200 can be the sum of the heights of back cover assembly 260, outer periphery member 220, and front cover assembly 250).

In some embodiments (not shown), one or both of front cover assembly 550 and back cover assembly 560 can partially cover front surface 524 and back surface 522, respectively, such that the entirety of the cover assembly is not recessed relative to outer periphery member 520. In some cases, the cover assembly can include an interior lip such that the lip can extend into the volume enclosed by outer periphery member 520, while a stepped up portion of the assembly offset from the lip can extend over a front or back surface of the outer periphery member.

Figure 6:
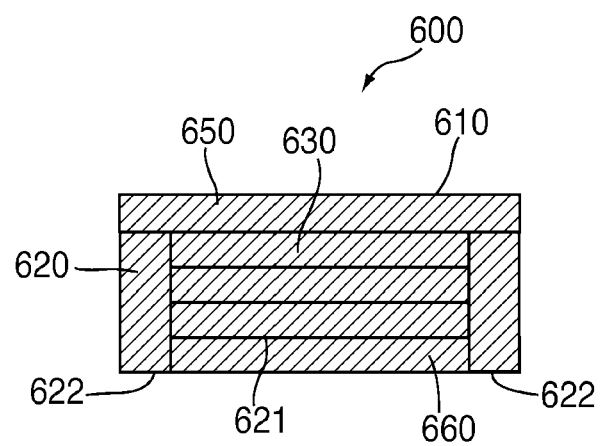
FIG. 6 is a cross-sectional view of an illustrative electronic device assembly in accordance with one embodiment of the invention.

In some embodiments, one or both of the cover assemblies can instead be partially or entirely recessed within the outer periphery member. FIG. 6 is a cross-sectional view of an illustrative electronic device assembly in accordance with one embodiment of the invention. Electronic device 600 can include outer periphery member 620 having some or all of the features of outer periphery member 220 (FIGS. 2A-2E). In particular, outer periphery member 620 can include one or more features for retaining electronic components within the device (e.g. component 630). The front and back surfaces of electronic device 600 can be provided in part by front cover assembly 650 and back cover assembly 660, which can include some or all of the features of front cover assembly 250 and back cover assembly 260 (FIGS. 2A-2E).

In contrast with electronic device 500 (FIG. 5), one or both of front cover assembly 650 and back cover assembly 660 can be placed within the periphery of outer periphery member 620 (e.g., recessed within the outer periphery member). In the particular example of FIG. 6, back cover assembly 660 can be recessed within outer periphery member 620, while front cover assembly 650 can be placed over the front surface of outer periphery member 620 (e.g., be proud). Back cover assembly 660 can be sized such that some or all of the back cover assembly can fit within volume 621 defined by outer periphery member 620. In particular, back cover assembly 660 can be positioned such that back surface 622 of outer periphery assembly 620 remains exposed to a user. Any suitable amount of back cover assembly 660 can be recessed within outer periphery member 620. For example, the entirety of back cover assembly 660 can be recessed within outer periphery member 620 such that the back surface of back cover assembly 660 is flush with or behind back surface 622 of outer periphery member 620. The resulting height of electronic device 600 can then be the sum of the heights of outer periphery member 620 and front cover assembly 650 (and only the height of the outer periphery member if both cover assemblies are recessed, as illustrated in FIG. 5). Alternatively, a portion of back cover assembly 660 can extend beyond back surface 622 while remaining within the periphery defined by outer periphery member 620. In such cases, the amount by which back cover assembly 660 extends beyond back surface 622 can be included in the total height of device 600.

Returning to electronic device 300 (FIGS. 3A-3C), front cover assembly 350 and back cover assembly 360 can be constructed from any suitable material or combination of materials. In some embodiments, each of cover assemblies 350 and 360 can be constructed by combining several distinct elements. For example, one or both cover assemblies can include a transparent or translucent plate (e.g., a rectangular plate of glass). As another example, one or both cover assemblies can include a base or support structure constructed from one or more of a metal or plastic (e.g., aluminum) onto which a transparent element can be assembled. The transparent element can be assembled using any suitable approach, including for example such that one or more electronic device components can be visible through the transparent element (e.g., display circuitry or a flash for image capture). As another example, the transparent element can be provided to receive signals or detect a user's environment through the transparent element (e.g., using sensors or a camera). Alternatively, one or more portions of the transparent element can be rendered opaque (e.g., using an ink, or by placing a support structure behind the transparent element) such that the transparent element can primarily serve as a cosmetic component. The different components of each cover assembly can be assembled using any suitable approach, including for example using one or more of an adhesive, fastener, tape, interlocking components, overmolding or manufacturing process, or any combination of these.

In the example of FIGS. 3A-3C, front cover assembly 350 can include support structure 352 on which glass plate 354 is assembled. Support structure 352 can include one or more openings, including an opening through which display 355 can be provided. In some embodiments, one or both of support structure 352 and glass plate 354 can include openings for device components, such as button opening 356 and receiver opening 357, as well as other openings for a camera, flash, or other device sensors or input interfaces. The size and shape of the openings can be selected using any suitable approach, including for example based on the size and shape of the device components placed in or underneath the openings (e.g., opening 356 can determined by the size of the button, while opening 357 can be determine from the size of a receiver, and acoustic considerations for providing sufficient audio to a user).

In some embodiments, glass plate 354 can include a cosmetic finish hiding from view internal components of the electronic device. For example, an opaque layer can be applied region 359 surrounding display 355 to hide from view the non-display portions of the display circuitry. Because one or more sensors may receive signals through glass plate 354, the opaque layer can be selectively removed, or selected to allow signals to pass through the glass plate to a sensor behind the plate. For example, glass plate 354 can include regions 359a and 359b through which sensors (e.g., a camera, infrared sensor, proximity sensor, or ambient light sensor) can receive signals.

In some embodiments, front cover assembly 350 can support or enable one or more interfaces by which a user can use the electronic device. For example, glass plate 354 can support a touch interface (e.g., a touch pad or a touch screen) for controlling electronic device processes and operations. As another example, front cover assembly 350 can include one or more buttons or sensors (described above) for interacting with the device. In some cases, buttons, switches or other interface elements can be instead or in addition incorporated in outer periphery member 320 or back cover assembly 360. Electronic device 300 can include any other suitable interface for interacting with a user, including for example display circuitry, a projector, audio output circuitry (e.g., speakers or a an audio port), a haptic interface (e.g., a motor for creating vibrations, or a power source for providing an electrical stimulus), or combinations of these.

To enhance the cosmetic or aesthetic appeal of electronic device 300, one or all of outer periphery member 320, front cover assembly 350 and back cover assembly 360 can be finished using an appropriate process. For example, one or more of polishing, coating (e.g., using a dye or coloring material, or a material providing an optical effect), glazing, thin film deposition, grinding, superfinishing, or any other suitable process can be applied to electronic device components. In some embodiments, one or more glass surfaces (e.g., of front cover assembly 350 or of back cover assembly 360) can be finished to provide an aesthetically pleasing appearance, for example using one or more masks, coatings (e.g., photochromatic or dichroic coatings), ink layers, or combinations of these. The particular finishes applied to the glass surfaces of front cover assembly 350 and back cover assembly 360 can be selected so that front and back surfaces 310 and 312 have similar or different appearances. In some embodiments, a glass surface can be treated to resist wear or impacts (e.g., scratch resistance), oils from touching, or any other external force applied to the device.

Figure 7:
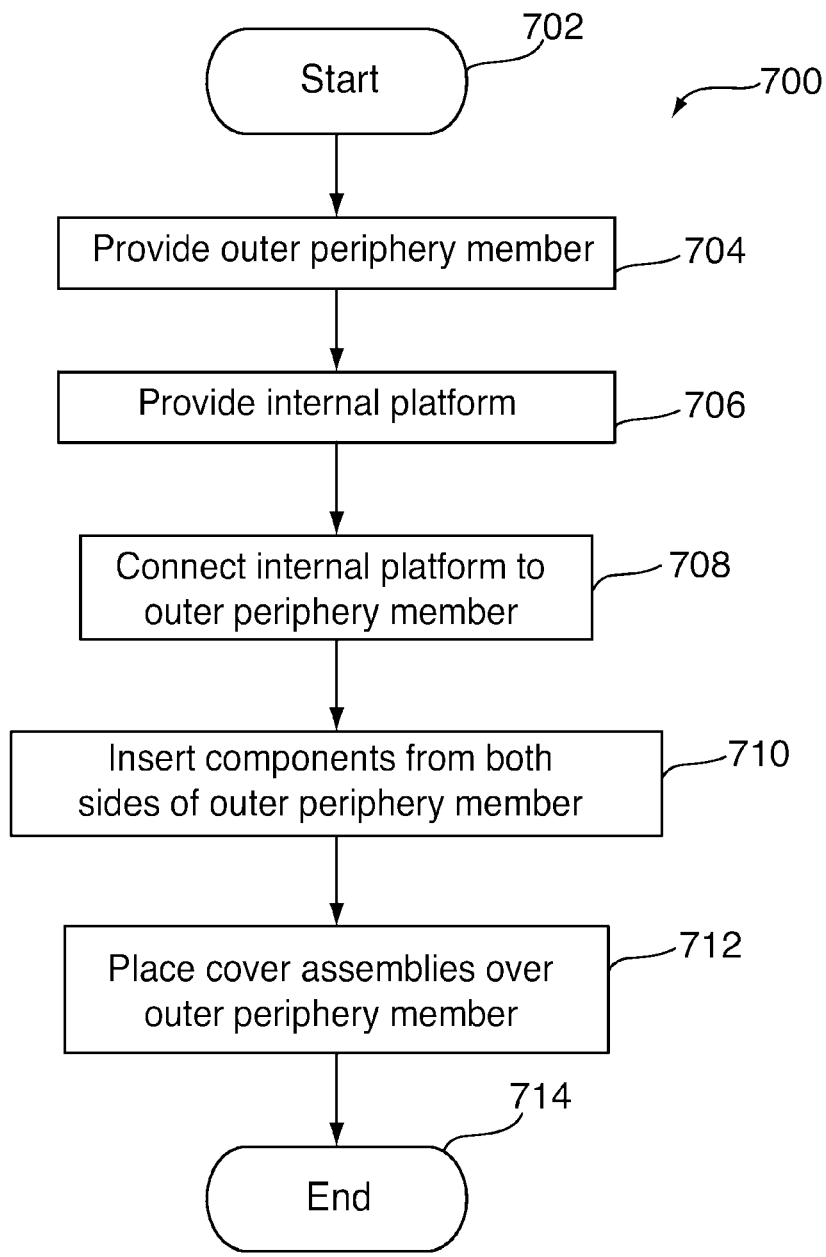
FIG. 7 is a flowchart of an illustrative process for assembling an electronic device in accordance with one embodiment of the invention.

FIG. 7 is a flowchart of an illustrative process for assembling an electronic device in accordance with one embodiment of the invention. Process 700 can begin at step 702. At step 704, an outer periphery member can be provided. For example, a housing component constructed in the shape of a loop can be provided. The outer periphery member can be constructed using any suitable approach, including for example by connecting together several distinct elements using intermediate elements 430. The outer periphery member can be constructed from any suitable material or combination of materials, including for example conductive and insulating materials, where the conductive materials are provided for elements forming parts of electrical circuits. At step 706, an internal platform can be provided. For example, a component having at least one planar region can be provided, where the component is sized to at least partially fit within a volume enclosed by the outer periphery member. The internal platform can be constructed from one or more elements including, for example, by combining several elements. In some embodiments, different conductive elements can be combined in a manner that electrically insulates the conductive elements of the internal platform.

At step 708, the internal platform can be connected to the outer periphery member. For example, the internal platform can be inserted into a volume defined by the outer periphery member, and retained by the outer periphery member. Any suitable approach can be used to retain the internal platform, including for example a press fit, mechanical fastener, an adhesive, molding process (e.g., using an intermediate material 430), soldering, welding, or combinations of these. In some embodiments, the process used can be selected based on conductive properties of the process. In some embodiments, the internal platform can be connected to the band in a manner that increases the structural integrity of the outer periphery member (e.g., improve resistance to a particular type of force). The internal platform can divide the volume enclosed by the outer periphery member into two regions or pockets, where each pocket is accessible from an opposite side or surface of the outer periphery member (e.g., from the front or back of the outer periphery member). At step 710, electronic device components can be inserted into the volume enclosed by the outer periphery member. For example, components can be inserted from one or both surfaces of the outer periphery member, into one or both of the pockets defined by the internal platform. Components can be inserted individually, and later connected to each other within the outer periphery member, or can instead be at least partially connected outside of the pockets, and inserted, as component assemblies, into the outer periphery member. Individual components or component assemblies can be connected to the internal platform, or can connect to components placed in the other pocket through the internal platform.

At step 712, cover assemblies can be placed over open surfaces of the outer periphery member. For example, a front cover assembly can be placed over a front surface of the outer periphery member, and a back cover assembly can be placed over a back surface of the outer periphery member. The cover assemblies can be connected or coupled to the outer periphery member using any suitable approach, including for example using one or more hooks, recesses, protrusions, interlocks, mechanical fasteners, springs, or other retention components. The cover assemblies can serve as external surfaces of the device, such that components inserted within the volume of the outer periphery member (e.g., at step 710) can be retained and constrained within the device. In some embodiments, one or both of the front and back cover assemblies can be aligned relative to internal components of the device to ensure that an internal component can operate properly. For example, a window of the cover assembly can be aligned with a sensor, light source, or display of the device. Process 700 can then end at step 714.

The previously described embodiments are presented for purposes of illustration and not of limitation. It is understood that one or more features of an embodiment can be combined with one or more features of another embodiment to provide systems and/or methods without deviating from the spirit and scope of the invention.

What is claimed is:

1. A portable electronic device comprising:
   a display; and
   a housing enclosing the display and comprising:
      a front cover assembly defining a first portion of a front surface of the portable electronic device;
      a back cover assembly defining a first portion of a back surface of the portable electronic device; and
      an outer periphery member attached to the front and back cover assemblies and defining a side surface that extends around the front surface, a second portion of the front surface, and a second portion of the back surface, the outer periphery member comprising:
         a first member comprising a first metal material defining a first portion of the side surface and extending from the second portion of the front surface to the second portion of the back surface;
         a second member comprising a second metal material defining a second portion of the side surface and extending from the second portion of the front surface to the second portion of the back surface;
         a third member comprising a third metal material defining a third portion of the side surface and extending from the second portion of the front surface to the second portion of the back surface;
         a first intermediate member comprising a first plastic material positioned between the first member and the second member and forming a fourth portion of the side surface; and
         a second intermediate member comprising a second plastic material positioned between the second member and the third member and forming a fifth portion of the side surface.

2. The portable electronic device of claim 1, wherein the first portion of the front surface defined by the front cover assembly and the second portion of the front surface defined by the outer periphery member define an entirety of the front surface of the portable electronic device.

3. The portable electronic device of claim 2, wherein the first portion of the back surface defined by the back cover assembly and the second portion of the back surface defined by the outer periphery member define an entirety of the back surface of the portable electronic device.

4. The portable electronic device of claim 1, wherein:
   the first portion of the front surface defined by the front cover assembly is flush with the second portion of the front surface defined by the outer periphery member; and
   the first portion of the back surface defined by the back cover assembly is flush with the second portion of the back surface defined by the outer periphery member.

5. The portable electronic device of claim 1, wherein:
   the portable electronic device further comprises processing circuitry; and
   the first member is operably coupled to the processing circuitry and is configured to operate as an antenna of the portable electronic device.

6. The portable electronic device of claim 1, wherein the front cover assembly comprises a front glass sheet that defines the first portion of the front surface.

7. The portable electronic device of claim 1, wherein:
   the housing further comprises an internal platform positioned between the front and back cover assemblies; and
   the portable electronic device comprises one or more electronic device components that are attached to the internal platform.

8. The portable electronic device of claim 1, wherein the first, second, and third metal materials are a steel material.

9. An electronic device comprising:
   a touch screen display; and
   a housing comprising:
      an outer periphery member surrounding the touch screen display and defining a side surface that extends around a perimeter of the electronic device, a peripheral front surface of the electronic device, and a peripheral back surface of the electronic device, the outer periphery member comprising:
         a first member comprising a first electrically conductive material and forming a first portion of the side surface, a first portion of the peripheral front surface, and a first portion of the peripheral back surface;
         a second member comprising a second electrically conductive material and forming a second portion of the side surface, a second portion of the peripheral front surface, and a second portion of the peripheral back surface;
         a third member comprising a third electrically conductive material and forming a third portion of the side surface, a third portion of the peripheral front surface, and a third portion of the peripheral back surface;
         a first intermediate member comprising a first electrically insulating material positioned between the first member and the second member and forming a fourth portion of the side surface; and
         a second intermediate member comprising a second electrically insulating material positioned between the second member and the third member and forming a fifth portion of the side surface;

a front cover assembly having a front sheet defining a central front surface of the electronic device; and a back cover assembly having a back sheet defining a central back surface of the electronic device.

10. The electronic device of claim 9, wherein:

the electronic device further comprises processing circuitry configured to perform wireless circuit control functions; and the first member is operably coupled to the processing circuitry and configured to operate as an antenna.

11. The electronic device of claim 9, wherein:

the peripheral front surface and the central front surface together define an entirety of a front surface of the electronic device; and the peripheral back surface and the central back surface together define an entirety of a back surface of the electronic device.

12. The electronic device of claim 9, wherein:

the peripheral front surface of the outer periphery member is flush with the central front surface of the front sheet; and the peripheral back surface of the outer periphery member is flush with the central back surface of the back sheet.

13. The electronic device of claim 9, wherein:

the front sheet is formed from a first glass material; and
the back sheet is formed from a second glass material.

14. The electronic device of claim 9, wherein:

the first electrically conductive material is a first aluminum material; and the second electrically conductive material is a second aluminum material; and the third electrically conductive material is a third aluminum material.

15. An electronic device comprising:

a display;

a camera module; and a housing enclosing the display and the camera module, the housing comprising:

an outer periphery member comprising:

a first member comprising a first electrically conductive material and defining a first portion of a side surface, a first portion of a front surface, and a first portion of a back surface;

a second member comprising a second electrically conductive material and defining a second portion of the side surface, a second portion of the front surface, and a second portion of the back surface;

a third member comprising a third electrically conductive material and defining a third portion of the side surface, a third portion of the front surface, and a third portion of the back surface;

a first intermediate member comprising a first electrically insulating material positioned between the first member and the second member and forming a fourth portion of the side surface;

a second intermediate member comprising a second electrically insulating material positioned between the second member and the third member and forming a fifth portion of the side surface;

a front cover assembly defining a third portion of the front surface; and a back cover assembly defining a third portion of the back surface and a camera window positioned over the camera module.

16. The electronic device of claim 15, wherein the outer periphery member defines a closed ring structure that surrounds the display.

17. The electronic device of claim 15, wherein:

the outer periphery member defines a first opening and a second opening along the side surface; and the electronic device comprises a first audio component positioned proximate to the first opening and a second audio component positioned proximate to the second opening.

18. The electronic device of claim 15, wherein:

the first electrically conductive material is a first steel material and extends from the front surface to the back surface of the electronic device;

the second electrically conductive material is a second steel material and extends from the front surface to the back surface of the electronic device; and the third electrically conductive material is a third steel material and extends from the front surface to the back surface of the electronic device.

19. The electronic device of claim 15, wherein the third portion of the front surface defined by the front cover assembly is flush with the first portion of the front surface defined by the first member and the second portion of the front surface defined by the second member.

20. The electronic device of claim 15, wherein:

the front cover assembly comprises a front glass member that defines the third portion of the front surface; and the back cover assembly comprises a back glass member that defines the third portion of the back surface.

* * * * *